United States Patent
Lin et al.

(10) Patent No.: US 7,884,029 B2
(45) Date of Patent: Feb. 8, 2011

(54) SOLAR CELL, SOLAR MODULE AND SYSTEM AND FABRICATION METHOD THEREOF

(75) Inventors: Shih-Cheng Lin, Hsinchu County (TW);
Wei-Chih Chang, Tainan County (TW);
Yi-Chin Chou, Changhua County (TW);
Chorng-Jye Huang, Hsinchu (TW);
Pin-Sheng Wang, Hsinchu County (TW)

(73) Assignee: DelSolar Co., Ltd., Science-Based Industrial Park, Hsinchu (TW)

( * ) Notice: Subject to any disclaimer, the term of this patent is extended or adjusted under 35 U.S.C. 154(b) by 14 days.

(21) Appl. No.: 12/480,697

(22) Filed: Jun. 9, 2009

(65) Prior Publication Data

US 2009/0305457 A1   Dec. 10, 2009

Related U.S. Application Data

(60) Provisional application No. 61/060,108, filed on Jun. 9, 2008.

(51) Int. Cl.
*H01L 21/302* (2006.01)
*H01L 21/461* (2006.01)

(52) U.S. Cl. ............... 438/753; 438/508; 438/706; 438/745; 257/E21.042; 257/E21.077; 257/E21.134; 257/E21.217; 257/E21.333; 257/E21.229; 257/E21.347

(58) Field of Classification Search ............... 438/753, 438/706, 745, 746, 501, 505, 508, 509, 603, 438/604, 622, 687, 688; 257/E21.042, 77, 257/134, 135, 217, 229, 333, 347
See application file for complete search history.

(56) References Cited

U.S. PATENT DOCUMENTS

| | | | |
|---|---|---|---|
| 4,751,191 A * | 6/1988 | Gonsiorawski et al. | 438/72 |
| 5,118,362 A | 6/1992 | St. Angelo | |
| 5,178,685 A * | 1/1993 | Borenstein et al. | 136/244 |
| 5,328,520 A * | 7/1994 | Itagaki | 136/256 |
| 6,710,239 B2 | 3/2004 | Tanaka | |
| 2009/0301555 A1 * | 12/2009 | Lin et al. | 136/255 |

FOREIGN PATENT DOCUMENTS

| | | |
|---|---|---|
| CN | 1487531 A | 4/2004 |
| CN | 101150148 A | 3/2008 |
| JP | 2004-235276 | 8/2004 |

\* cited by examiner

*Primary Examiner*—David Nhu
(74) *Attorney, Agent, or Firm*—Winston Hsu

(57) ABSTRACT

A solar cell having an improved structure of rear surface includes a p-type doped region, a dense metal layer, a loose metal layer, at least one bus bar opening, and solderable material on or within the bus bar opening. The solderable material contacts with the dense aluminum layer. The improved structure in rear surface increases the light converting efficiency, and provides a good adhesion between copper ribbon and solar cell layer thereby providing cost advantages and reducing the complexity in manufacturing. A solar module and solar system composed of such solar cell are also disclosed.

15 Claims, 5 Drawing Sheets

SOLAR CELL, SOLAR MODULE AND SYSTEM AND FABRICATION METHOD THEREOF

CROSS REFERENCE TO RELATED APPLICATIONS

This application claims priority to and the benefit of U.S. provisional application Ser. No. 61/060,108 filed Jun. 9, 2008.

BACKGROUND OF THE INVENTION

1. Field of the Invention

The present invention relates to a solar cell and a method of making the same. More particularly, this invention relates to a solar cell with an improved rear surface structure, a solar module and a solar system composed of such solar cell.

2. Description of the Prior Art

For decades, the problems of the petroleum shortage and the greenhouse effect are getting worse and worse; therefore many countries invent more and more efforts in the development of energy saving products, such as solar cell. Worldwide solar system installations increased by 5,948 MW in 2008, up from 2,826 MW installed during the previous year. In 1985, annual solar installation demand was only 21 Megawatts. The market size of solar cell industry has increased several times from 1985 and has become a hot business coming after the semiconductor. The solar cells can be manufactured using a variety of semiconductor material or organic compound material, however, from the industrial viewpoint; silicon which is semiconductor is mainly used for the solar cells.

The solar cells using silicon can be roughly classified into a bulk type solar cell using a wafer of mono-crystalline silicon, multi-crystalline silicon or the like and a thin film solar cell having a semiconductor film formed on a substrate. The bulk type solar cell, which is the most commonly known solar cell having the largest scale of commercial market than other types of solar cells. It has been well known that in the solar cells, a good ohmic contact between the electrode and the n/p doped region will make it easier to collect the electron and hole and it will also produce a reduction of ohmic loss and thus increases the photovoltaic conversion efficiency.

In the front surface of p type solar cell, the front surface field is made by doping an n-type impurity in the whole front side. So the front side electrode can be in contact with front n doped region with good ohmic contact. In the rear surface of such solar cell, aluminum (Al), which is a cost effective material with good conductivity is most commonly used for making the p-type doped region. It has been well known that the p-type doped region can form the Back Surface Field (BSF) in the rear surface of solar cell. However, an aluminum oxide layer will be formed upon the process of forming the p-type doped region. Such aluminum oxide layer will not only increase contact resistance but also bring the difficulty for solar cell soldering.

Several technologies have been disclosed for resolving foregoing problem, for instance, by depositing a discontinued Al layer on the rear surface of solar cell to form a discontinued p-type doped region which is the most commonly used in the conventional solar cell manufacturing.

The semiconductor substrate will be exposed in such discontinued region and a silver paste, or other suitable metal pastes, can be applied to such discontinued region to form a solderable interconnection pad.

However, in such structure, the electron-hole recombination will be increased, the fill-factor (F.F.) and the short-circuit current (Isc) will be decreased. As a result, photovoltaic conversion efficiency decreases.

SUMMARY OF THE INVENTION

Accordingly, it is one object of the invention to provide an improved rear surface for a solar cell such that the recombination of electron-hole pairs at the metal/semiconductor interface of the solar cell is reduced.

It is another object of the invention to provide a solar cell with a solderable rear surface which is cost effective in manufacturing process and material chosen.

Further, it is a method of the invention to provide an improved solar cell bettering the efficiency also reducing the manufacturing cost of solar cells at present.

To achieve the advantages described above, one embodiment of this invention provides an improved rear surface structure of a solar cell therefore to be described as: (1) a loose metal layer; (2) a p-type doped region between the loose metal layer and the rear surface; (3) a dense metal layer between the loose metal layer and p-type doped region; (4) at least one bus bar opening made by removing the loose metal layer; and (5) a solderable material deposited on or within the bus bar opening. The loose metal layer, dense metal layer and the p-type doped region thereof are formed by firing the metal paste. The loose metal layer is a loose structure composed by metal particles wherein the structure contains many voids. Relatively, the dense metal layer is a dense structure composed of metal-silicon alloy that is formed after firing the metal paste, wherein the composition of the metal-silicon alloy is metal substantially.

The bus bar opening is made by removing the loose metal layer of the pre-selected area on rear surface by the methods including but not limited to: (1) laser ablation; (2) wet etching achieved by photo-resist coating and then the loose metal layer is etched by immersing in chemical solution such as NaCl and $H_2SO_4$ contained liquid under a suitable temperature; (3) dry etching carried out by mixed gas comprising Boron Trichloride ($BCl_3$), Chloride ($Cl_2$), Chloroform ($CHCl_3$), Nitrogen ($N_2$), and ammonia ($NH_3$); (4) physical removing by high pressure gas, liquid or solid particles, and can be realized by spray gun; (5) ultrasonic cleaning in the water and (6) rubbing. When the bus bar opening is made by those alternative methods, however, care must be taken to assure that the dense metal layer should be exposed therefore providing a good electrical contact with the solderable material.

The solderable material is chosen to have a good solderability with the dense metal layer and ribbon. Thus, for instance, silver, copper, tin, zinc, palladium, nickel and alloy thereof could act as a good solderable material in this invention.

The solderable material is applied on or within the bus bar opening by methods including but not limited to: (1) sputtering; (2) vapor deposition; (3) strip or patch coating (4) ink-jet printing, screen printing, gravure printing, letter printing, thermal printing, dispensing or transfer printing; (5) stamping; (6) electroplating; (7) electroless plating, or (8) combinations thereof. It is understood that the method of applying solderable material on or within the bus bar opening will be highly relied on the composition of the solderable material.

The metal paste is chosen to act as a p-type doping source, therefore such metal paste shall be composed of at least one of the elements of the III A group. Hence, either the loose metal layer or dense metal layer is made using the metal paste composed of at least one of the elements of the III A group.

A method of fabricating foregoing solar cell is also provided in this invention, The method includes the following steps: (1) providing a metal paste coated on the entire or substantial area of the rear surface of solar cell; (2) forming a loose metal layer, a dense metal layer and a p-type doped region by firing the metal paste; (3) forming at least one bus bar opening by selectively removing said loose metal layer; (4) applying a solderable material on or within the bus bar opening. The p-type doped region is under said dense metal layer and loose metal layer and extending on rear surface inwardly and the dense metal is between p-type doped region and the loose metal layer.

In addition, a solar module and a solar system composed of one or more foregoing solar cells are also disclosed in this invention.

The basic structure of a solar module of the present invention is composed of a solar cell assembled with a front film and a back film which is sandwiched in between the back face member and a transparent front face member. And such solar cell assembly is composed of one or more solar cells fabricated by the method disclosed in the present invention and each solar cell of such solar cell assembly is interconnected to other solar cells electrically and mechanically by a conductor.

Further, the front film and back film are composed of organic resin compositions such as EVA, EMA, acrylic resins, silicone elastomers, PVB, epoxy resins or aliphatic polyesterurethanes and the like.

Furthermore, in such solar module, generally, glass or a transparent polymer material such as fluororesin film, an acrylic resin film and the like is used to for the front face member and glass materials, metal sheets, hard plastics and the like are used for the back face member. Still further, the back face member has an insulating material like polyethylene terephthalate (PET), nylon and TEDLAR® is used between the back face member and the solar cell assembly.

There is also a solar system provided having above-mentioned structure of one or more solar modules with one or more solar cells encapsulated by front film and back film and then covered by front face member and back face member, wherein the solar cells are fabricated by the method disclosed in the present invention. The structure of such solar system is further composed an inverter. The applications for the solar system disclosed in the present invention generally separated by two types: (1) connected with the utility power grid and (2) disconnected with the utility power grid.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
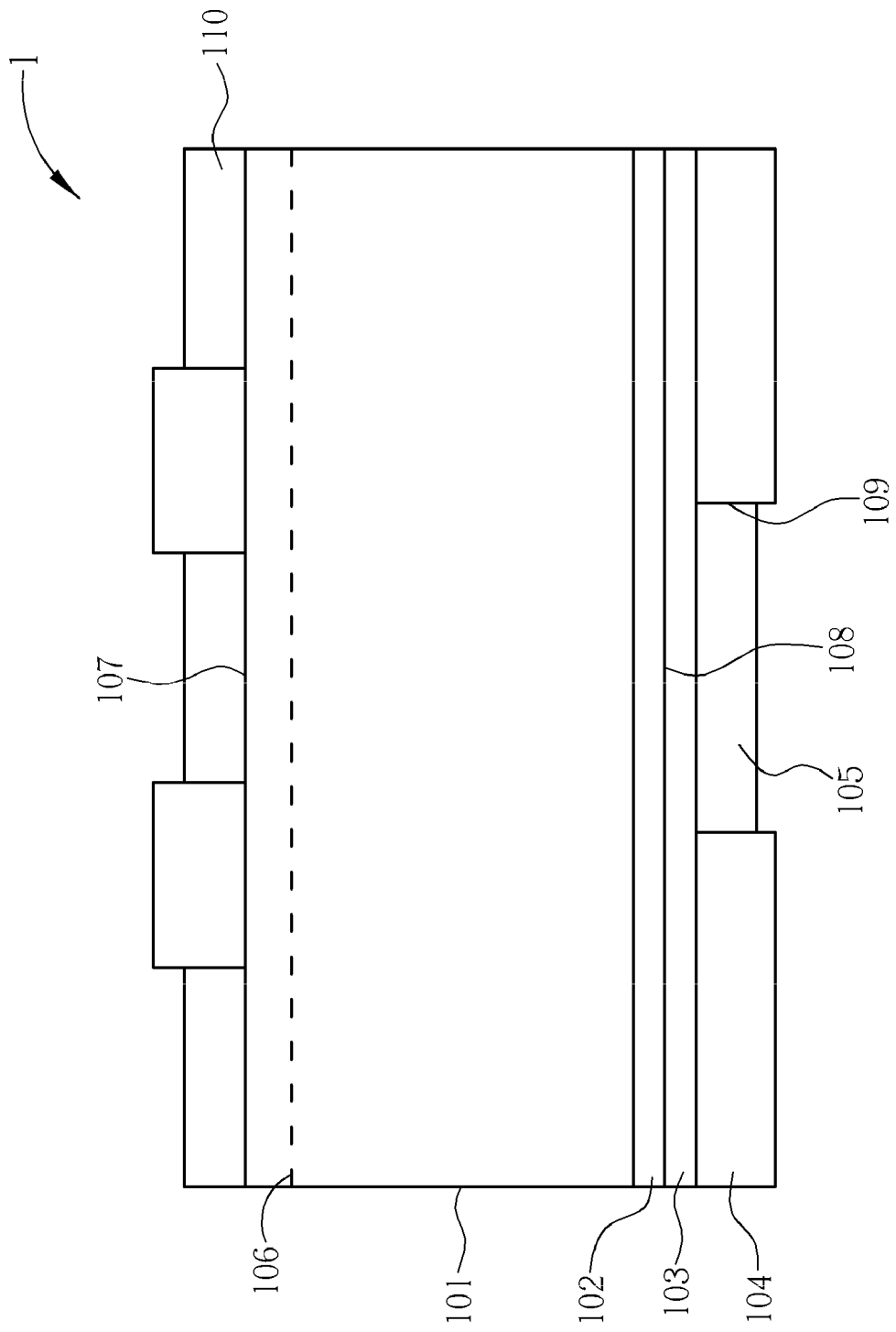
FIG. 1 is a cross-sectional side view of the solar cell fabricated in the present invention.

In accordance with one embodiment of this invention, an improved rear surface structure of a solar cell includes: (1) a loose metal layer; (2) a p-type doped region between the loose metal layer and the rear surface; (3) a dense metal layer between the loose metal layer and p-type doped region; (4) at least one bus bar opening made by removing the loose metal layer; and (5) a solderable material deposited on or within the bus bar opening. The loose metal layer, dense metal layer and the p-type doped region thereof are formed by firing the metal paste. The loose metal layer is a loose structure composed by metal particles wherein the structure contains a plurality of voids. Relatively, the dense metal layer is a dense structure composed of metal-silicon alloy that is formed after firing the metal paste, wherein the composition of the metal-silicon alloy is metal substantially.

The bus bar opening may be made by removing the loose metal layer of the pre-selected area on rear surface by the methods including but not limited to: (1) laser ablation; (2) wet etching achieved by photo-resist coating and then the loose metal layer is etched by immersing in chemical solution such as NaCl and H2SO4 contained liquid under a suitable temperature; (3) dry etching carried out by mixed gas comprising Boron Trichloride (BCl3), Chloride (Cl2), Chloroform (CHCl3), Nitrogen (N2), and ammonia (NH3); (4) physical removing by high pressure gas, liquid or solid particles, and can be realized by spray gun; (5) ultrasonic cleaning in the water and (6) rubbing. When the bus bar opening is made by those alternative methods, however, care must be taken to assure that the dense metal layer should be exposed therefore providing a good electrical contact with the solderable material.

The solderable material is chosen to have a good solderability with the dense metal layer and ribbon. Thus, for instance, silver, copper, tin, zinc, palladium, nickel and alloy thereof could act as a good solderable material in this invention.

The solderable material is applied on or within the bus bar opening by methods including but not limited to: (1) sputtering; (2) vapor deposition; (3) strip or patch coating (4) ink-jet printing, screen printing, gravure printing, letter printing, thermal printing, dispensing or transfer printing; (5) stamping; (6) electroplating; (7) electroless plating, or (8) combinations thereof. It is understood that the method of applying solderable material on or within the bus bar opening will be highly relied on the composition of the solderable material.

The metal paste is chosen to act as a p-type doping source, therefore such metal paste shall be composed of at least one of the elements of the III A group. Hence, either the loose metal layer or dense metal layer is made using the metal paste composed of at least one of the elements of the III A group.

A method of fabricating foregoing solar cell is also provide in this invention, The method includes the following steps: (1) providing a metal paste coated on the entire or substantial area of the rear surface of solar cell; (2) forming a loose metal layer, a dense metal layer and a p-type doped region by firing the metal paste; (3) forming at least one bus bar opening by selectively removing said loose metal layer; (4) applying a solderable material on or within the bus bar opening. The p-type doped region is under said dense metal layer and loose metal layer and extending on rear surface inwardly and the dense metal is between p-type doped region and the loose metal layer.

In addition, a solar module and a solar system composed of one or more foregoing solar cells are also disclosed in this invention.

The basic structure of a solar module of the present invention is composed of a solar cell assembled with a front film and a back film which is sandwiched in between the back face member and a transparent front face member. And such solar cell assembly is composed of one or more solar cells fabricated by the method disclosed in the present invention and each solar cell of such solar cell assembly is interconnected to other solar cells electrically and mechanically by a conductor.

Further, the front film and back film are composed of organic resin compositions such as EVA, EMA, acrylic resins, silicone elastomers, PVB, epoxy resins or aliphatic polyesterurethanes and the like.

Furthermore, in such solar module, generally, glass or a transparent polymer material such as fluororesin film, an acrylic resin film and the like is used to for the front face member and glass materials, metal sheets, hard plastics and the like are used for the back face member. Still further, the back face member has an insulating material like polyethylene terephthalate (PET), nylon and TEDLAR® is used between the back face member and the solar cell assembly.

There is also a solar system provided having above-mentioned structure of one or more solar modules with one or more solar cells encapsulated by front film and back film and then covered by front face member and back face member, wherein the solar cells are fabricated by the method disclosed in the present invention. The structure of such solar system is further composed an inverter. The applications for the solar system disclosed in the present invention generally separated by two types: (1) connected with the utility power grid and (2) disconnected with the utility power grid.

Figure 2:
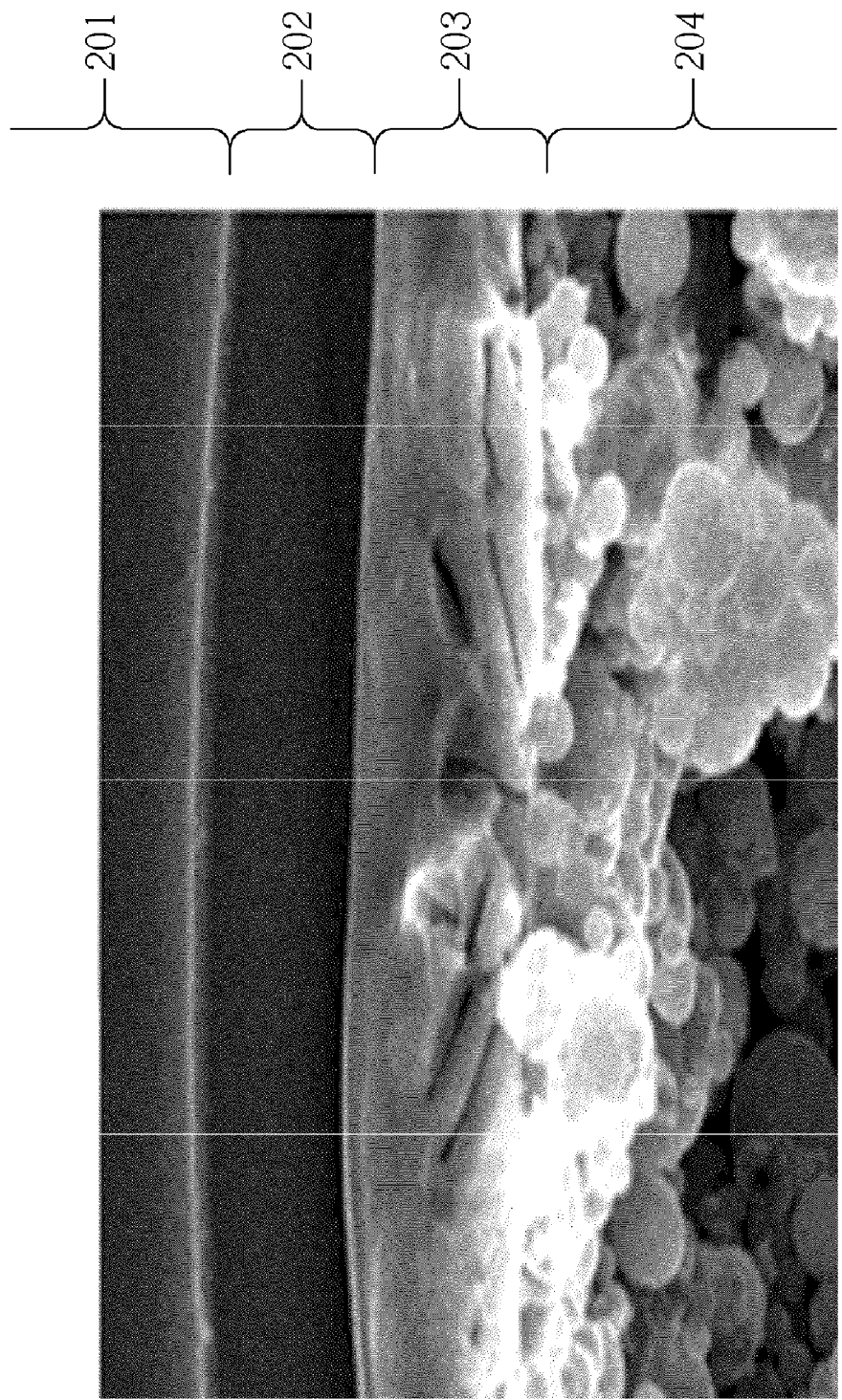
FIG. 2 is a SEM picture in the cross-sectional side view of the rear surface of the solar cell fabricated in the present invention.

An improved structure of solar cell according to one embodiment of the invention is shown in FIG. 1 and FIG. 2. The solar cell includes a semiconductor substrate 101,201 having a p-n junction 106 located adjacent to its front surface 107. An anti-reflective (AR) coating 110 is coated on the front surface 107 of the semiconductor substrate 101, 201. A p-type doped region 102, 202 located adjacent to the rear surface 108 of semiconductor substrate 101, 201.

In the preferred embodiment, the metal paste is composed of aluminum and all area of the rear surface 108 is covered with aluminum paste and fired at high temperature under 1200° C. for forming aluminum and silicon alloy. During the cooling down process, the p-type doped region 102,202, dense aluminum layer 103,203, and loose aluminum layer 104,204 are formed. The dense aluminum layer 103,203 is in contact with p-type doped region 102,202 so as to form ohmic contacts in between the dense aluminum layer 103,203, p-type doped region 102,202 and the semiconductor substrate 101,201. The loose aluminum layer 104,204 is composed of aluminum particles formed by high temperature reaction of aluminum paste, and its structure is loose. The loose aluminum layer is a loose structure composed by metal particles wherein the structure contains many voids. Relatively, the dense aluminum layer is a dense structure composed of metal-silicon alloy forming after firing aluminum paste, wherein the composition of the aluminum-silicon alloy is aluminum substantially.

The bus bar opening(s) 109 are made by removing the loose aluminum layer with laser ablation to thereby expose the underlying dense aluminum layer 103. The wavelength of laser used in the preferred embodiment is 300 to 1100 nm. However, care must be taken to assure that the dense aluminum layer 103,203 should be exposed therefore providing a good contact electrically with the solderable material 105.

Figure 3:
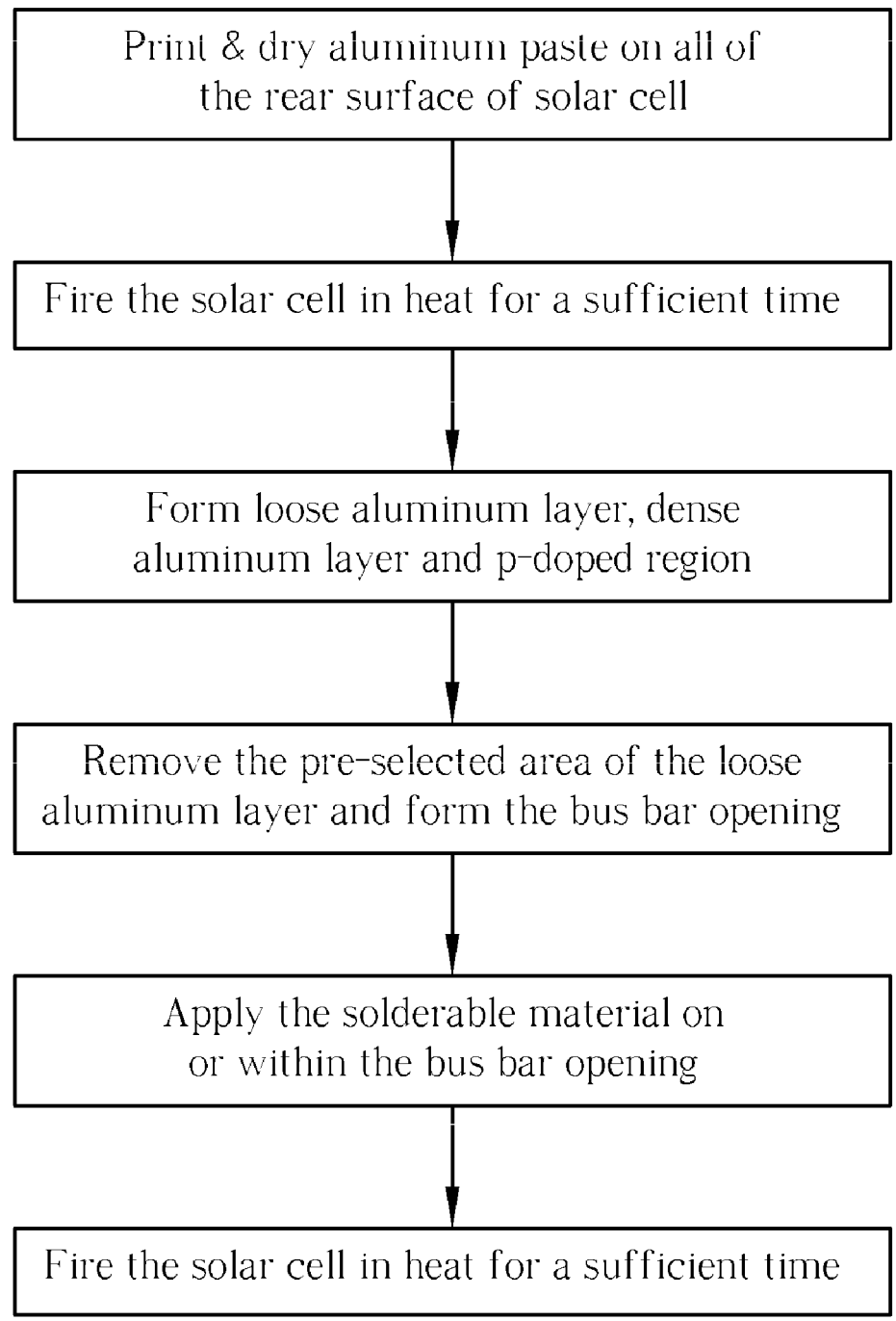
FIG. 3 shows the process of the method of making the solar cell in the present invention.

A preferred method of manufacturing a completed improved rear surface structure of solar cell in accordance with one embodiment of this invention is to be described with reference to FIG. 3. This method includes the following steps: (1) providing an aluminum paste coated on the entire or substantial area of the rear surface 108 of solar cell by printing aluminum paste directly; (2) forming a loose aluminum layer 104,204, a dense aluminum layer 103,203 and a p-type doped region 102,202 by firing the aluminum paste; (3) forming at least one bus bar opening 109 by selectively removing said loose aluminum layer 104,204, wherein the loose aluminum layer 104,204 is removed by laser ablation with a wavelength of 300 to 1100 nm; and (4) applying a solderable material 105 on or within the bus bar opening 109.

The solderable material 105 is chosen so as to connect the dense aluminum layer 103,203 and ribbon 403 for the connection of the solar cell mechanically and electrically to other solar cells. In the preferred case, the solderable material is composited of tin-zinc alloy containing 5 to 50% zinc. The solderable material 105 facilitates the formation of solderable contact(s) with ribbon while at the same time taking the advantage of reducing the complexity in manufacturing in comparison to the present conventional solar cells. In preferred case, the ribbon is coated with tin or tin-alloy.

The completed structure of the solar cell is illustratively shown in FIG. 1. Thereafter the solar cell may be further processed, e.g., to prepare it for connection to another solar cell.

Figure 4:
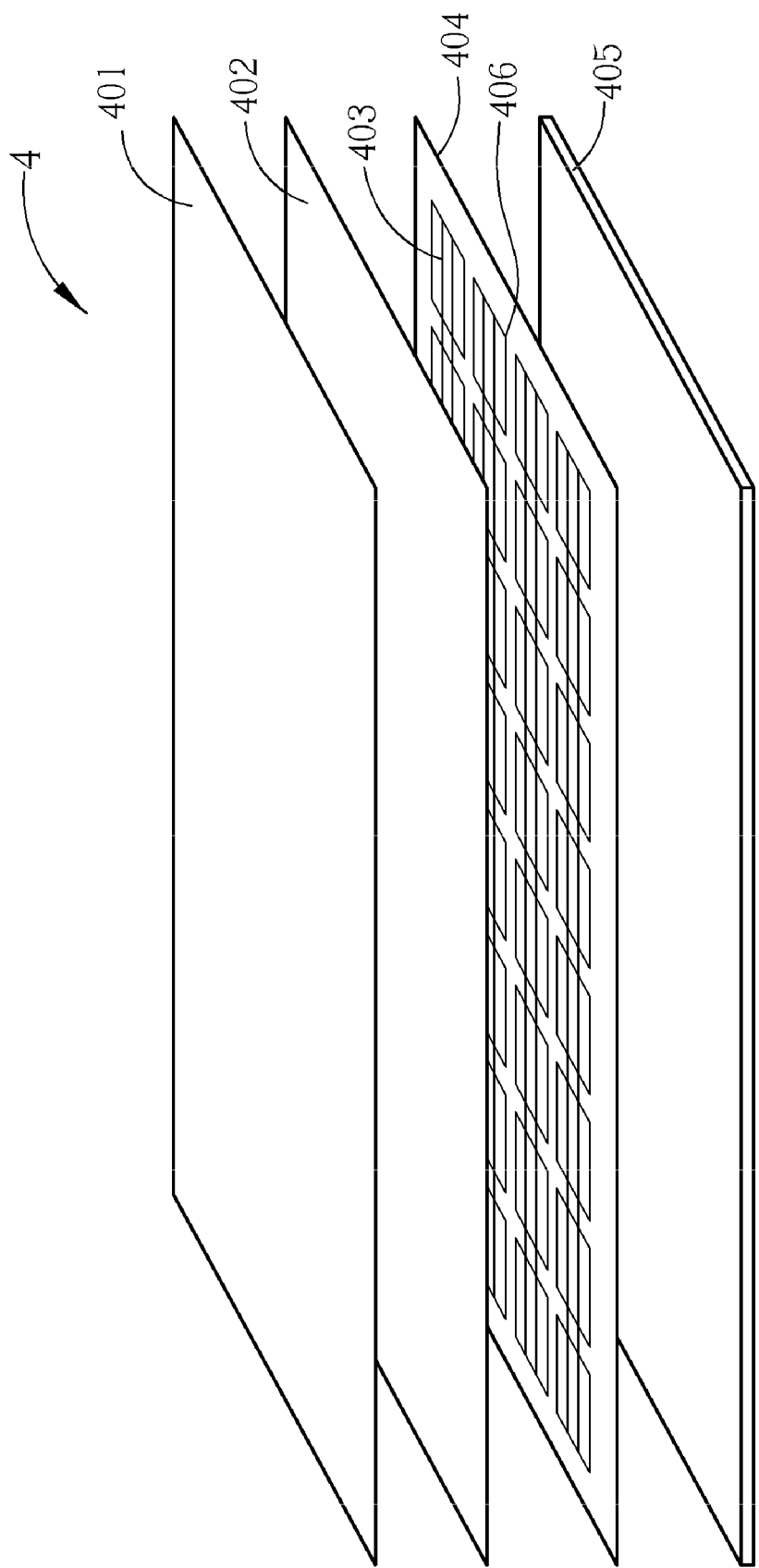
FIG. 4 shows one example of a structural view of the solar module with the solar cells made by the method of the present invention.

In the preferred structure of solar module shown in the FIG. 4 is composed of a plurality of solar cells 406 interconnected by ribbon 403 assembled with a front film 402 and a back film 404 which is sandwiched in between the back face member 405 and a transparent front face member 401. Further, the solar cells 406 are fabricated by the method disclosed in the present invention. In preferred solar module, glass is used for the front face member 401 and TEDLAR® is used for the back face member 405. Further, the front film 402 and back film 404 are organic resin preferably composed of EVA.

Figure 5:
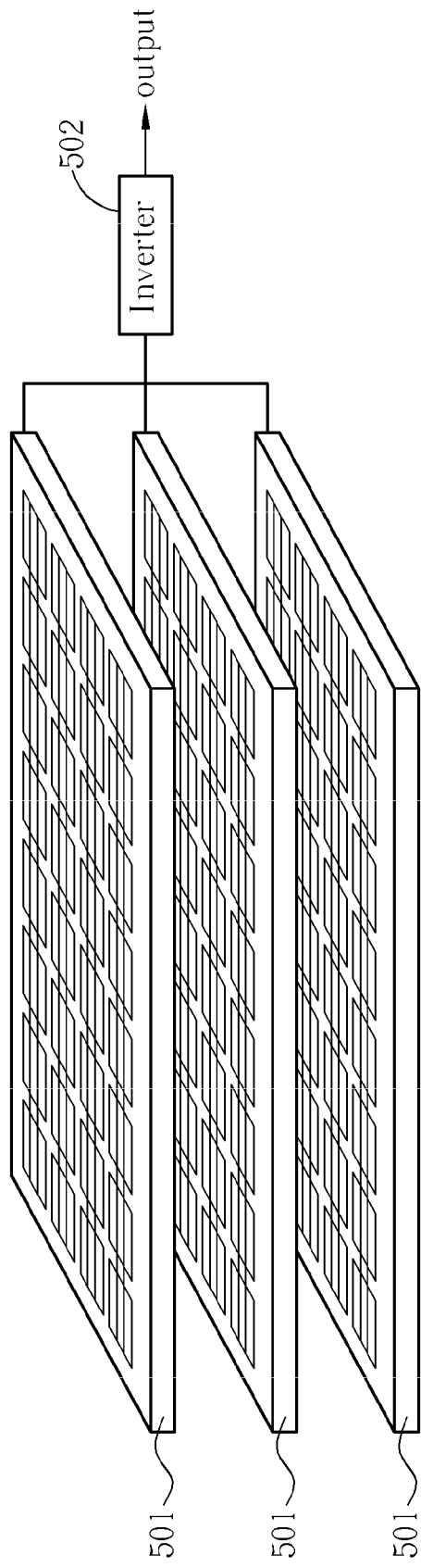
FIG. 5 is an example of a solar system with a plurality of solar modules and an inventor described in the present invention.

A preferred solar system shown in the FIG. 5 is also provided in present invention, the solar system thereof having the above-described solar module 501. In particular, such solar system comprising a plurality of solar modules with solar cells, which are fabricated by the method disclosed in the present invention. The structure of such solar system is further integrated with an inverter 502.

EXAMPLE

Hereinafter shows the results of experiments conducted on solar cell elements fabricated according to the foregoing embodiment.

As to substrate, two kinds of flat plate of p-type multi-crystalline silicon substrate and p-type monocrystallne silicon substrate of 156 mm×156 mm in size both are fabricated by the foregoing method.

TABLE 1

|  |  | Voc (V) | Isc (A) | FF (%) | Eff. (%) |
| --- | --- | --- | --- | --- | --- |
| Polysilicon | Conventional | 0.61 | 7.76 | 77.14 | 14.97 |
|  | This invention | 0.61 | 7.78 | 77.62 | 15.11 |
| Monosilicon | Conventional | 0.61 | 8.32 | 78.17 | 16.66 |
|  | This invention | 0.61 | 8.33 | 78.51 | 16.81 |

Table 1 shows the result of cell efficiency fabricated by the conventional method and the foregoing method pursuant to the preferred embodiment. By increasing Isc and FF, the efficiency is improved 0.14% in multi-crystalline and 0.15% in monocrystalline in this invention.

In view of the foregoing description of a preferred embodiment of this invention, various additional alternations, modifications, variations, and obvious substitutions will occur to those skilled in the art. It, therefore, should be understood that the above description of the invention is intended to be illustrative only, and in no way limiting the scope of the invention. The invention rather should be understood as being limited only by the terms of the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a solar cell, comprising:
   providing a semiconductor substrate with a rear surface;
   providing a metal paste coated on an entire or a substantial area of the rear surface of said semiconductor substrate;
   firing said metal paste to form a loose metal layer, a dense metal layer and a p-type doped region; and
   forming at least one bus bar opening by removing a portion of said loose metal layer.

2. The method of fabricating a solar cell according to claim 1 wherein a solderable material is applied on or within said bus bar opening.

3. The method of fabricating a solar cell according to claim 1 wherein a firing temperature for firing said metal paste is no more than 1200° C.

4. The method of fabricating a solar cell according to claim 1 wherein said bus bar opening is formed by removing said loose metal layer by a method or combination of methods including: (1) laser ablation; (2) wet etching; (3) dry etching; (4) physical removing; (5) ultrasonic; (6) rubbing.

5. The method of fabricating a solar cell according to claim 1 wherein said dense metal layer is made using the material of III A group.

6. The method of fabricating a solar cell according to claim 1 wherein said loose metal layer is made using the material of III A group.

7. The method of fabricating a solar cell according to claim 2 wherein said solderable material is applied on or within said bus bar opening by a process selected from the group consisting of: (1) sputtering; (2) vapor deposition; (3) strip or patch coating (4) ink-jet printing, screen printing, gravure printing, letter printing, thermal printing, dispensing or transfer printing; (5) stamping; (6) electroplating; (7) electroless plating, and (8) a combination thereof.

8. The method of fabricating a solar cell according to claim 1 wherein said bus bar opening is formed by removing said loose metal layer by laser ablation.

9. The method of fabricating a solar cell according to claim 1 wherein said dense metal layer comprises substantial composition of aluminum.

10. The method of fabricating a solar cell according to claim 1 wherein said loose metal layer comprises substantial composition of aluminum.

11. The method of fabricating a solar cell according to claim 2 wherein said solderable material is selected from the group consisting of: silver, copper, tin, zinc, palladium, nickel and alloys or mixtures thereof.

12. The method of fabricating a solar cell according to claim 2 wherein said solderable material is tin-zinc alloy.

13. The method of fabricating a solar cell according to claim 1 wherein said at least one bus bar opening is formed by removing a portion of said loose metal layer to thereby expose a portion of said dense metal layer.

14. The method of fabricating a solar cell according to claim 1 wherein said at least one bus bar opening is formed by removing a portion of said loose metal layer and a portion of said dense metal layer to thereby expose a portion of said p-type doped region.

15. The method of fabricating a solar cell according to claim 1 wherein said metal paste is composed of at least one of the elements of the III A group.

* * * * *